United States Patent
Kurosawa et al.

[11] Patent Number: 6,057,647
[45] Date of Patent: May 2, 2000

[54] LIGHT EMITTING DEVICE USED FOR DISPLAY DEVICE

[75] Inventors: Hiroshi Kurosawa, Fussa; Tomoyuki Shirasaki, Higashiyamato; Hiroyasu Jobetto, Hachioji, all of Japan

[73] Assignee: Casio Computer Co., Ltd., Tokyo, Japan

[21] Appl. No.: 09/218,278

[22] Filed: Dec. 22, 1998

[30] Foreign Application Priority Data

Feb. 24, 1998 [JP] Japan .................................. 10-057366

[51] Int. Cl.[7] ........................................................ G09G 3/10
[52] U.S. Cl. ..................................... 315/169.3; 315/169.1; 313/506; 313/505; 313/257; 313/292
[58] Field of Search ............................... 315/169.3, 169.1, 315/167; 313/505, 506, 509, 512, 498, 292, 257, 268

[56] References Cited

U.S. PATENT DOCUMENTS

| | | | |
|---|---|---|---|
| 4,734,623 | 3/1988 | Ohkoshi et al. | 315/169.4 |
| 5,518,808 | 5/1996 | Bruno et al. | 428/323 |
| 5,565,742 | 10/1996 | Shichao et al. | 315/366 |
| 5,859,508 | 1/1999 | Ge et al. | 315/366 |
| 5,936,347 | 8/1999 | Isaka et al. | 313/509 |

*Primary Examiner*—Haissa Philogene
*Attorney, Agent, or Firm*—Frishauf, Holtz, Goodman, Langer & Chick, P.C.

[57] ABSTRACT

In the present invention, a partition wall having a matrix shape is formed on anode electrodes so as to divide them further into dots of a small region, which are surrounded by the partition wall. With this structure, if a dark spot which is a non-light emitting region, is created in one dot, the growth of the spot can be stopped by the partition wall. Therefore, good display property can be maintained for a long time.

13 Claims, 16 Drawing Sheets

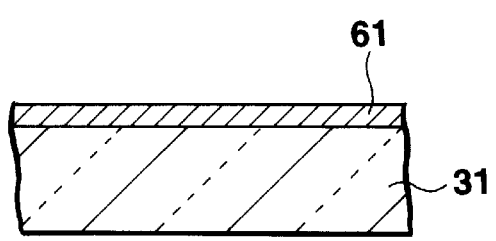
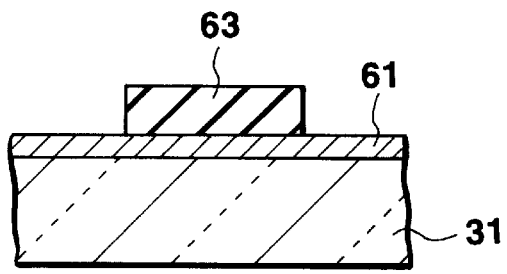
FIG.5A  FIG.5B
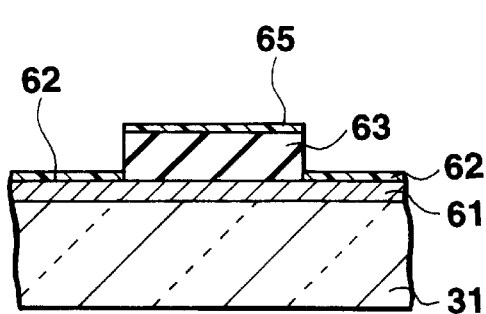
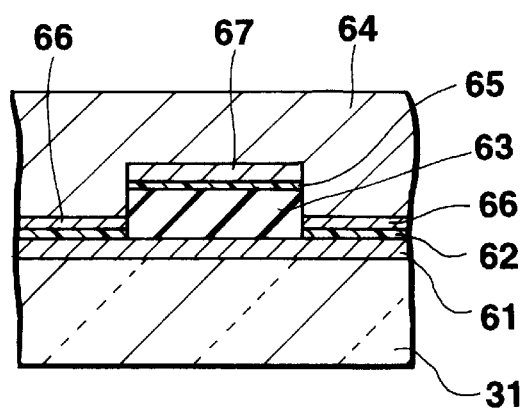
FIG.5C  FIG.5D

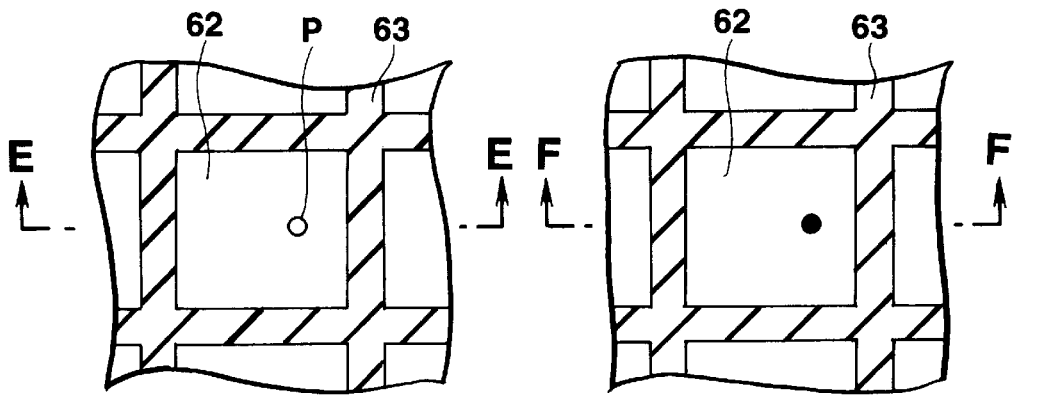
FIG.6A FIG.7A
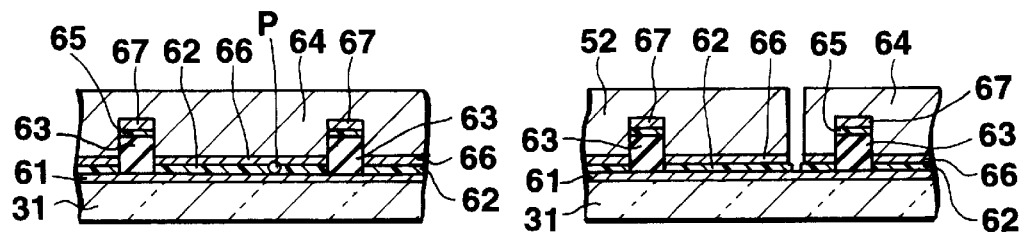
FIG.6B FIG.7B
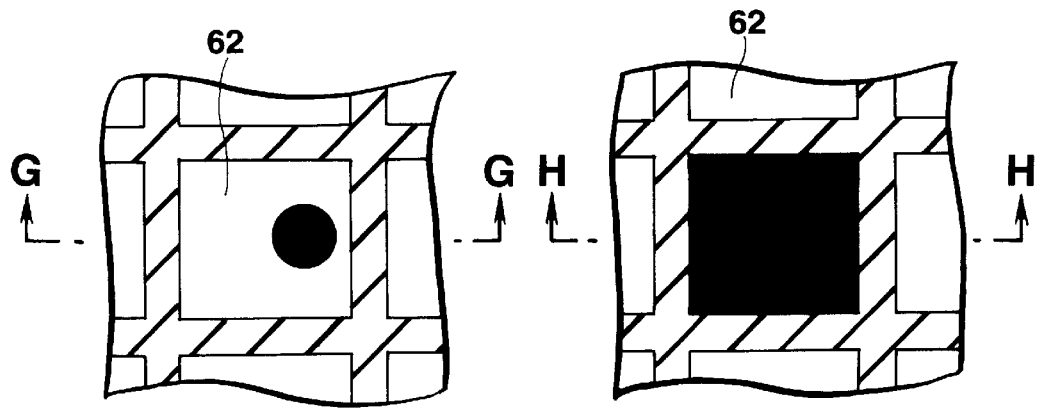
FIG.8A FIG.9A
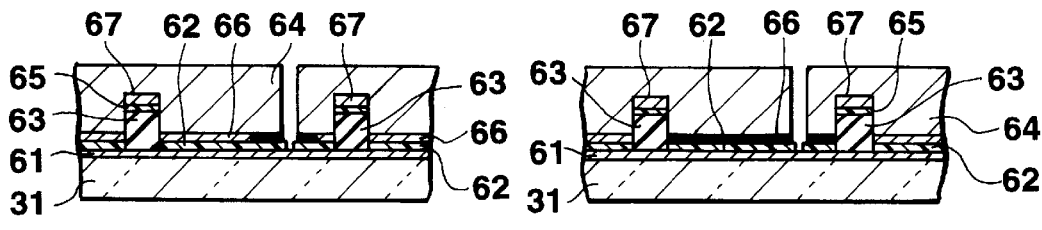
FIG.8B FIG.9B

LIGHT EMITTING DEVICE USED FOR DISPLAY DEVICE

BACKGROUND OF THE INVENTION

The present invention relates to a light emitting device used for a display device, in particular, to a light emitting device which can suppress the growth of a so-called dark spot.

A light emitting element called an organic electroluminescent element is conventionally known. In such an element, an organic electroluminescent (EL) thin film is interposed between electrodes, and by applying a voltage between the electrodes, carriers are injected to the organic EL thin film, thus generating light.

Generally, an organic EL element has a structure in which an anode (electrode) which is a transparent element, an organic EL layer and a cathode (electrode) made of a single mental or a metal alloy, are formed in the order, on a substrate made of glass or the like.

In the process of manufacturing the organic EL element, if there is a particle (small piece of trash, dust, undesired material or the like, these will be called particle hereinafter) present, in particular, on the electrode (anode electrode) immediately before the formation of the organic EL layer, the particle remains in the interface between the anode and the organic EL layer formed thereon.

In case where the organic EL layer is formed while a particle remains as described, the following problems easily occur.

First, the thickness of the organic EL layer is usually 500 nm or less; however the intensity of the electric field applied in order to inject carriers to the organic EL layer becomes extremely high as about several thousand V/m. Consequently, with the presence of a particle which usually exceeds 1 μm in size, short-circuiting easily occurs between the electrodes. Due to the short-circuit between the electrodes, the sections of the cathode and organic EL layer, where the particle was present, were damaged, thus causing a pin hole.

In general, as compared to an anode, a cathode has a tendency of being easily oxidized since it is made of a metal having a high electron injection property. When oxygen or moisture enters the cathode from the pin hole, the cathode is oxidized, and the work function is significantly increased. Further, when the cathode is oxidized to a certain thickness, it becomes difficult to inject electrons to the organic EL layer. As a result, there would be a section created in the organic EL element, where light is not generated even if a predetermined voltage is applied (the section will be called dark spot hereinafter). In addition, the cathode is oxidized in a radial manner with the pin hole serving as the nucleus, and therefore the dark spot grows in a radial manner in the surface direction along with time, from the firstly generated spot as the nucleus.

In order to avoid such a problem, the following method is conventionally employed. That is, the organic EL element is coated with a sealing member such as of resin, or another substrate is provided above the organic EL element, and silicone oil is sandwiched between these substrates, so as to inhibit oxygen and moisture from entering the cathode. However, with the sealing member or silicone oil, it is not possible to fully avoid the entrance of oxygen and moisture to the cathode, and therefore the creation and growth of a dark spot cannot be completely suppressed.

In the case of an organic EL element in which a cathode is divided into pieces for each one of pixels, which is a light emitting region of the minimum unit, once a dark spot is locally created on the cathode of a pixel, eventually, the entire pixel is covered with the dark spot. In the case of an organic EL element having a simple matrix structure in which one cathode is formed continuously over a plurality of pixels, as a common electrode, the oxidization of the cathode occurs not only on the pixel in which a pin hole is created, but also expands to an adjacent pixel or pixels.

Therefore, the number of pixels which do not generate light increases gradually. Thus, the size of the dark spot increases along with time, and the display vision quality of the organic EL element is extremely deteriorated.

BRIEF SUMMARY OF THE INVENTION

The object of the present invention is to provide a light emitting element used for a display device, which can maintain a high display vision quality for a long time by suppressing the growth of a so-called dark spot.

Thus, according to the present invention, there is provided a display device having a plurality of pixels each including one first electrode, one partition wall having a plurality of openings, formed on the first electrode, a plurality of light emitting layers formed respectively in the plurality of openings of the partition wall, and surrounded by the partition wall, a plurality of conductive layers formed respectively on the plurality of light emitting layers, and surrounded by the partition wall, and a second electrode for covering the plurality of conductive layers and the partition wall.

With the above-described structure, even if oxygen enters from a pin hole or the like and one of the conductive layers is oxidized thereby, the other conductive layers will not be oxidized due to the oxidization of that particular one of the conductive layers, since it is made noncontinuously with the other conductive layers by the partition wall. Therefore, when the partition wall having a plurality of openings is provided for the pixels, it becomes possible to S prevent the growth of one dark spot to one entire pixel. Therefore, in the display device of an active matrix structure in which the second electrode is divided into a plurality of sections for the respective pixels, it is possible to remarkably solve the problem of the point defect caused by the dark spot, and in the display device of a simple matrix structure in which the second electrode is formed continuously over a plurality of pixels, it is possible to prevent the line defect caused by the dark spot remarkably.

According to the present invention, there is further provided another display device having a plurality of anodes, and a plurality of cathodes, wherein in each pixel comparted as a region where one of the plurality of anodes and one of the plurality of cathodes cross, one partition wall having a plurality of openings for exposing the plurality of anodes is formed, light emitting regions are formed separately in the respective openings of the partition wall, conductive layers are formed separately on the light emitting regions in the respective openings of the partition wall, and the cathodes covers the conductive layers and partition wall.

With the above-described structure, even if one of the conductive layers is oxidized, the other conductive layers are not oxidized because of the oxidization of the particular one of the conductive layers since it is formed noncontinuously to the other conductive layer by the partition wall.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A to 5D are explanatory diagrams showing an example of the method of manufacturing a display device of the present invention, wherein, FIG. 5A is a schematic cross section showing the step of forming an anode on a substrate, FIG. 5B is a schematic cross section showing the step of forming a partition wall on the anode, FIG. 5C is a schematic cross section showing the step of forming an organic EL layer, and FIG. 5D is a schematic cross section showing the step of forming a cathode;

FIGS. 6A to 9B are explanatory diagrams illustrating the growth of a dark spot, wherein, FIG. 6A is a schematic plan view showing the generation of a particle during the process of manufacturing an organic EL element, FIG. 6B is a schematic cross section taken along the line E—E of FIG. 6A, FIG. 7A is a schematic plan view showing the creation of a pin hole in the cathode, FIG. 7B is a schematic cross section taken along the line F—F of FIG. 7A, FIG. 8A is a schematic plan view showing the process in which a dark spot is grown in one dot, FIG. 8B is a schematic cross section taken along the line G—G of FIG. 8A, FIG. 9A is a schematic plan view showing the state in which the dark spot stops growing in one dot, and FIG. 9B is a schematic cross section taken along the line H—H of FIG. 9A;

FIGS. 17A to 17D are explanatory diagrams illustrating the manufacture of the organic EL element, wherein, FIG. 17A is a schematic diagram showing the photolithography step of the process of manufacturing the organic EL element, FIG. 17B is a schematic cross section showing the step of forming a partition wall on the anode, FIG. 17C is a schematic cross section showing the step of forming an organic EL layer, and FIG. 17D is a schematic cross section showing the step of forming a cathode;

DETAILED DESCRIPTION OF THE INVENTION (First Embodiment)

A display device according to the present invention will now be described in detail with reference to accompanying drawings.

Figure 3:
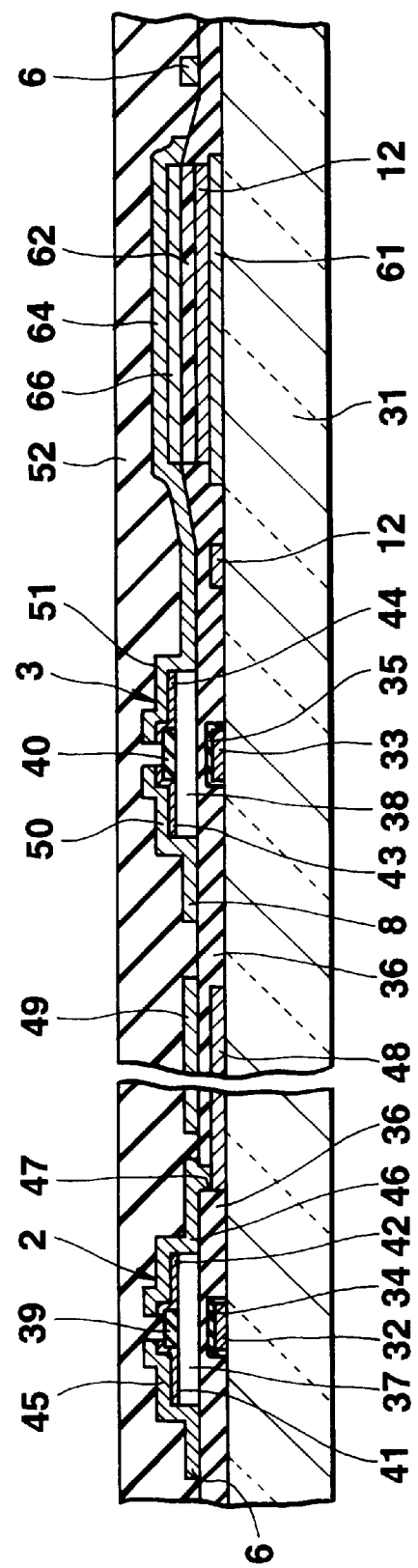
FIG. 3 is a schematic cross section taken along the line C—C of FIG. 2.

First, the drive circuit of a display device 1 shown in FIG. 1 will now be described. As shown, pixels each including a selection transistor 2, a drive transistor 3, an organic EL element 4 and a capacitor 7, are arranged in matrix, that is, in vertical and horizontal lines, on a substrate 31 (FIG. 3). An address line 5 is connected to a gate electrode of each selection transistor 2 and a data line 6 is connected to a drain electrode of each selection transistor 2. A source electrode of each selection transistor 2 is connected via the capacitor 7 to a gate electrode of a drive transistor 3, and also is grounded via a ground line 12. A drain electrode of the drive transistor 3 is connected to a power line 8, and a source electrode of the transistor 3 is connected to a cathode of an organic EL element 4. An anode of the organic EL element 4 is grounded via the ground line 12.

An address driver circuit 9 and a data driver circuit 10 are provided on the substrate such that they are arranged along the respective two sides of pixels aligned in matrix. The address lines 5 are connected respectively to terminals X1, X2, . . . Xm of the address driver circuit 9, and the data lines 6 are connected to Y1, Y2, . . . Yn of the data driver circuit 10. The power line 8 is connected to a power source 11, which supplies a negative potential.

Figure 1:
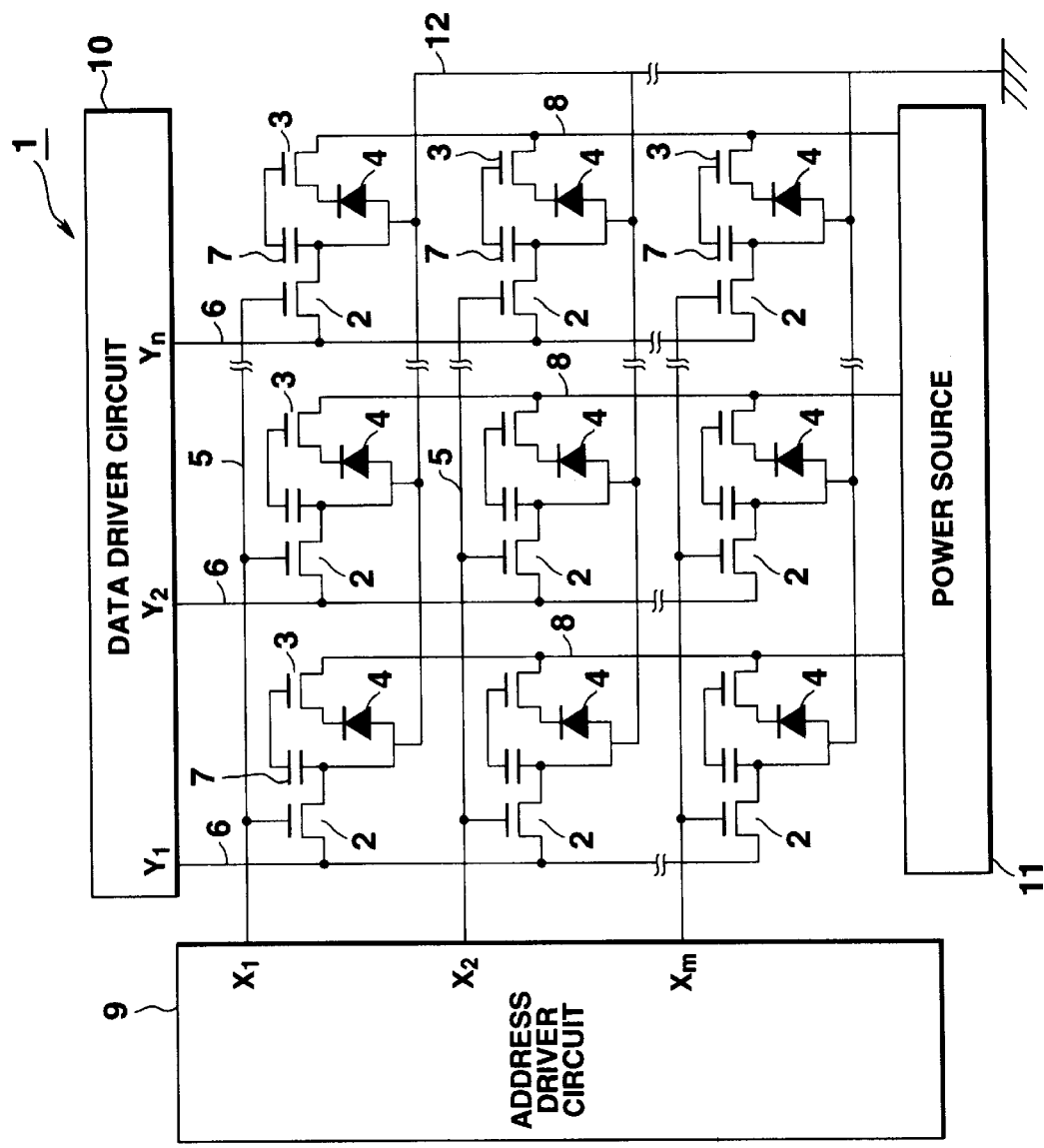
FIG. 1 is an equivalent circuit diagram showing an active drive type display device according to a first embodiment of the present invention.
Figure 2:
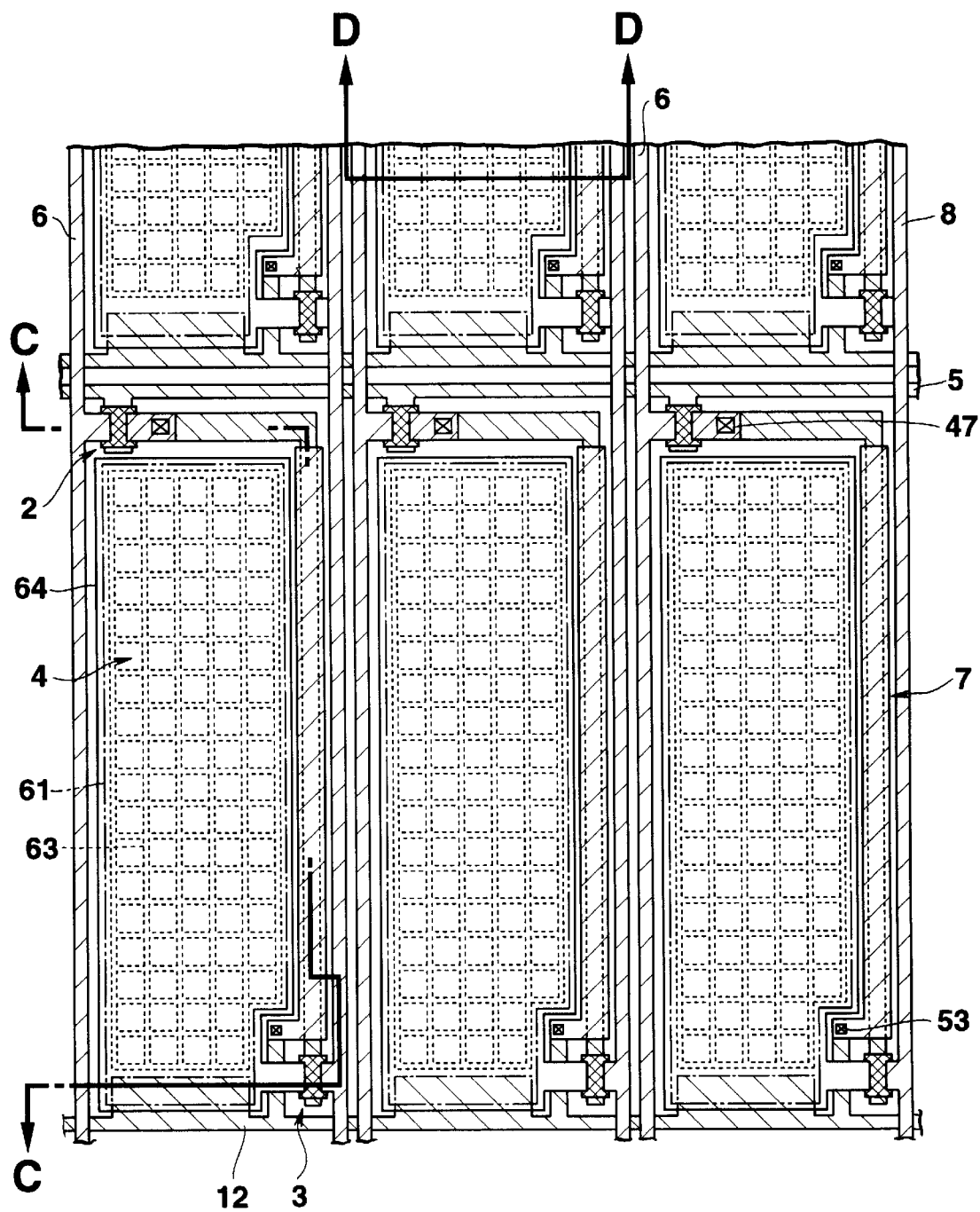
FIG. 2 is a schematic plan view showing a part of the display device shown in FIG. 1.

FIG. 2 is a structural diagram showing pixel regions shown in FIG. 1. FIG. 3 is a cross section taken along the line C—C of FIG. 2, and FIG. 4 is a cross section taken along the line D—D of FIG. 2.

The display device 1 has a structure in which a selection transistor 2 which is an n-channel thin film transistor, a drive transistor 3 which is an n-channel thin film transistor, an organic EL element 4 and the like are formed on a substrate 31 made of glass or synthetic resin which is transparent to visible light.

The following are descriptions of a specific structure of the device. That is, a gate metal film made of, for example, aluminum is patterned on the substrate 31, so as to form a plurality of address lines 5 arranged in a certain direction to be in parallel to each other at an equal interval, gate electrodes 32 of selection transistors 2, which are connected to the address lines 5, gate electrodes 33 of drive transistors 3 and lower wiring layers 48 of the capacitors 7. On the surfaces of the gate electrodes 32 and 33 and the address lines 5, anodic oxide films 34 and 35 which can be obtained by anodizing the surface of the gate metal film, are formed. Further, on the address lines 5, the gate electrodes 32 and 33, the lower wiring layers 48 and the substrate 31, a gate insulation film 36 made of silicon nitride is formed. On the gate insulation film 36 situated above the gate electrodes 32 and 33, semiconductor layers 37 and 38 made of amorphous silicon or polycrystalline silicon are formed to have certain patterns. On the central portions of the semiconductor layers 37 and 38, blocking layers 39 and 40 are formed respectively along the width direction of the channel. On the semiconductor layer 37, ohmic layers 41 and 42 made of n-type amorphous silicon or n-type polycrystalline silicon, separated into a drain side and a source side by the blocking layer 39 as the boundary, are formed. Similarly, on the semiconductor layer 38, ohmic layers 43 and 44, separated into a drain side and a source side by the blocking layer 40 as the boundary, are formed. In the selection transistor 2, the drain (electrode) 45 laminated on the ohmic layer 41 (one of the two) is connected to the data line 6, and the source (electrode) 46 laminated on the other ohmic layer 42 is connected to the lower wiring layer 48 of the capacitor 7 via a contact hole 47 formed in the gate insulation film 36. The capacitor 7 is constructed by the lower wiring layer 48 formed of the gate metal film integrally with the gate electrodes 32 and 33, the portion of the gate insulation film 36, on the lower wiring layer 48, and an upper wiring layer 49 formed thereon, integrally with the source electrode 46 and the drain electrode 45. The lower wiring layer 48 is connected to the gate electrode 33 of the drive transistor 3. The upper wiring layer 49 is connected to a ground line 12 via a contact hole (FIG. 2) formed in the gate insulation film 36. In the drive transistor 3, the drain electrode 50 and the source electrode 51 are formed respectively on the ohmic layers 43 and 44. The drain electrode 50 is connected to the power line 8, and the source electrode 51 is connected to a cathode 64 of the organic EL element 4. An interlayer insulation film 52 is deposited on the selection transistor 2, the drive transistor 3 and the organic EL element 4, to have a thickness of about 400 nm to 1200 nm such that the upper surface of the film 52 is made flat.

Figure 4:
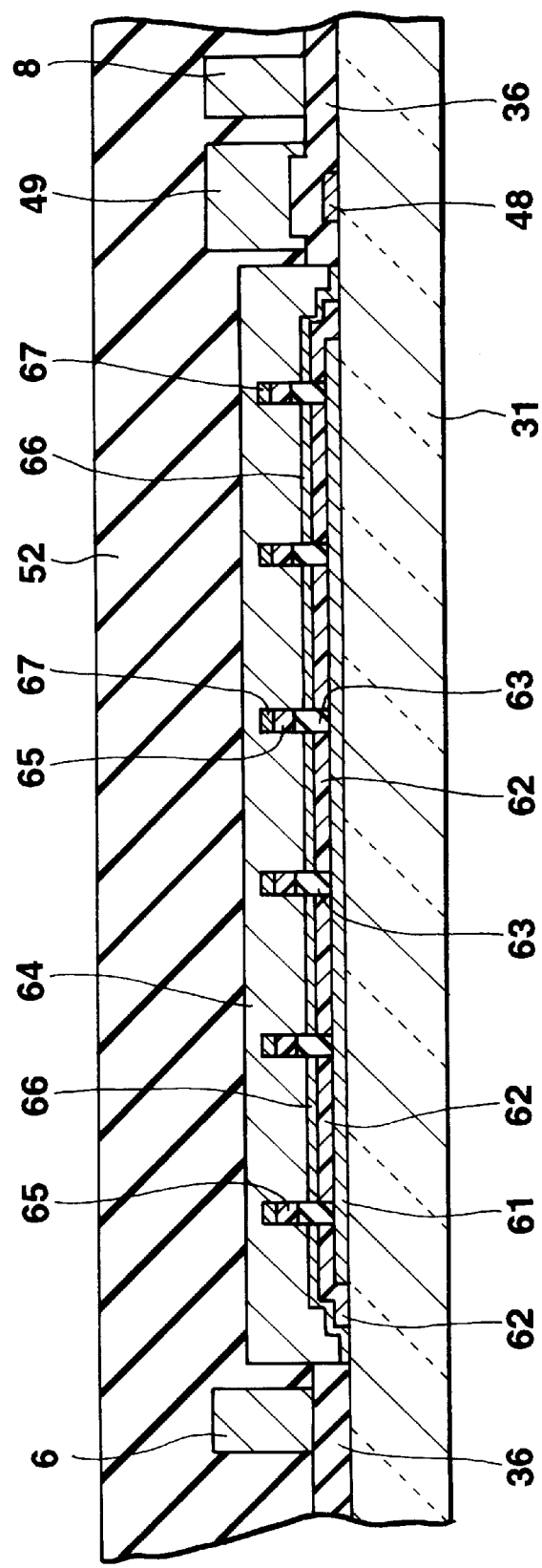
FIG. 4 is a schematic cross section taken along the line D—D.

Each organic EL element 4 includes an anode 61, an organic EL layers 62 and 65, an insulating partition wall 63, electron injection layers 66 and 67 and a cathode 64 which are formed in the order on the substrate 31 as shown in FIG. 4. The anode 61 is an electrode designed to inject positive holes to the organic EL layer 62, and is made of transparent indium tin oxide or indium zinc oxide. The anode is formed over the entire light emitting region, and the end portion thereof is connected to the ground line 12. The partition wall 63 is provided on the anode 61 for each and every pixel, and has a structure in which branches extend in the horizontal and vertical directions. With this structure, the partition wall has a plurality of square openings arranged in matrix, as it is surrounded by these branches. The partition wall 63 is formed to be integral with the smoothly formed gate insulation film 36, and has a thickness of about 150 nm to 500 nm. Each of the organic EL layers 62 and 65 is constructed by a plurality of organic layers such as, from the anode 61 side, a positive hole conveying layer made of N,N'-di(α-naphthyl)-N,N'-diphenyl-1,1'-biphenyl-4,4'-diamine, a light emitting layer made of 96% by weight of 4,4'-bis(2,2-diphenylvinylene)biphenyl and 4% by weight of 4,4'-bis((2-carbazole)vinylene)biphenyl, and an electron conveying layer made of aluminum-tris(8-hydroxyquinolinate). The entire thickness of each layer is about 40 nm to 250 nm, which is thinner than that of the partition wall 63. With regard to the organic EL layers, the organic EL layer 62 (light emitting region) is formed after the formation of the partition wall 63, and therefore it contributes to the light generation occurring within the opening of the partition wall located on the anode 61, whereas the organic EL layer 65 (non-light emitting region) situated on the partition wall 63 (branches) which does not contribute to the light emission. The organic EL layers 62 and 65 have substantially the same thickness and are formed to be separated from each other by the partition wall 63. With the above-described structure, the organic EL layer 62 is divided into 88 dots, four sides of each of which are surrounded by the partition wall 63, more specifically, the branches of the wall. Each dot is a right square having a side of 20 μm, and the width of the branch of the partition wall 63 is 4 μm. The electron injection layers 66 and 67 are conductive layers made of a single metal having a low work function, such as lithium or magnesium, or an alloy, or the like, and are layers for injecting electrons to the organic EL layers. One of the electron injection layers, that is, layer 66 is formed on one of the organic EL layers, that is, layer 62, and the other electron injection layer 67 is formed on the other organic EL layer 65. The layers 66, 67 have substantially the same thickness, specifically, about 5 nm to 200 nm, and are formed thinner than that of the partition wall 63. Further, they are separated by the partition wall 63. The partition wall 63 is formed to always have a thickness larger than the sum of the thickness of the organic EL layer 62 and the thickness of the electron injection layer 66. The cathode 64 is a conductive layer having a thickness of about 200 nm to 1000 nm and made of a single metal having a work function higher than those of the electron injection layers 66 and 67, such as aluminum or chromium, or an alloy which contains the mentioned single layer. This conductive layer is deposited such as to stride over the electron injection layer 66 in the opening of the partition wall 63 and the electron injection layer 67 on the branches of the partition wall 63. The cathode 64 is formed to be thicker than the partition wall 63, preferably, thicker than the sum of the thickness of the partition wall 63, the thickness of the organic EL layer 65 and the thickness of the electron injection layer 67. In each organic EL element 4, when a current of a predetermined value is allowed to flow between the anode 61 and the cathode 64, the organic EL layer 65 does not emit light since positive holes cannot be injected to the EL layer 65 due to the partition wall 63 which is a thick insulating material, whereas the organic EL layer 62 generates light as electrons and positive holes are injected to the organic EL layer 62 of 88 dots, and the portion of the organic EL layer 62, which is on the peripheral portion of the anode electrode 61.

Next, the process of manufacturing the organic EL element 4, the selection transistor 2 and the drive transistor 3 will now be described with reference to FIGS. 5A to 5D.

First, as can be seen in FIG. 5A, a transparent conductive layer is deposited on the entire surface of the substrate 31 to have a thickness of the layer of about 250 nm by a sputtering method, and the deposited layer is patterned by the photolithography method into an anode 61. Subsequently, the gate electrode 32 of the selection transistor 2, the anodic oxide film 34, the gate electrode 33 of the drive transistor 3, the anodic oxide film 35, the lower wiring layer 48 and the ground line 12 are formed.

Next, a silicon nitride film is deposited on the substrate 31 on which the anode 61 is formed, by the CVD (chemical vapor deposition) method to have a film thickness of 150 nm to 500 nm. The portions of the silicon nitride film, which are situated in the regions of the selection transistor 2 and the drive transistor 3 are left as gate insulation films. The portion of the silicon nitride film, which is situated in the light emitting region is processed by the photolithography method so as to form a partition wall 63 having a plurality of openings arranged in matrix, as can be seen in FIG. 5B. The partition wall 63 may be formed separately from the gate insulation film, in accordance with its optimal thickness.

Subsequently, the semiconductor layers 37 and 38, the blocking layers 39 and 40, and the ohmic layers 41, 42, 43 and 44 are formed, and then a positive hole conveying layer having a thickness of about 30 nm is formed in the light emitting region by vacuum deposition or printing using the ink jet method, further a light emitting layer having a thickness of about 40 nm is formed thereon by printing using the ink jet method or vacuum deposition, and furthermore, an electron conveying layer having a thickness of about 30 nm is formed thereon by vacuum deposition or printing using the ink jet method. With the operation described above, as shown in FIG. 5C, the organic EL layer 62 situated on the anode 61, which contributes to the light emission and the organic EL layer 65 situated on the partition wall 63, which does not contribute to the light emission, are formed non-continuously in a batch step. In this step, it is set that the thickness of the partition wall 63 exceeds the thickness of the organic EL layer 62, and therefore each and every organic EL layer 62 is separated from the respective organic EL layer 65 situated on the partition wall 63 by a step.

Further, as shown in FIG. 5D, at the same time as the formation of the electron injection layer 66 on the organic EL layer 62, the electron injection layer 67 is formed on the organic EL layer 65. The electron injection layers 66 and 67 are each made of a single metal having a low work function, such as lithium or magnesium, or an alloy of aluminum and the single metal having the work function, or the like. The partition wall 63 is formed to be always thicker than the sum of the thickness of the organic EL layer 62 and the thickness of the electron injection layer 66, and thus a step is created by the partition wall, which serves separate the electron injection layers 66 and 67 from each other. Subsequently, an aluminum alloy film having a thickness of about 200 nm to 1000 nm is formed and then the film is patterned to form source electrodes 46 and 51, drain electrodes 45 and 50, an upper wiring layer 49 and a cathode 64. After that, an interlayer insulation film 52 is formed to over the entire resultant.

Next, the process of the growth of a dark spot in the organic EL element will now be described with reference to FIGS. 6A to 9B. Of these figures, FIGS. 6A, 7A, 8A and 9A are plan views schematically showing one dot when the display device is viewed from the substrate 31 side and the partition wall 63 which surrounds the dot from four directions. FIGS. 6B, 7B, 8B and 9B are cross sections respectively taken along the line E—E of FIG. 6A, the line F—F of FIG. 7A, the line G—G of FIG. 8A, and the line H—H of FIG. 9A.

First, let us suppose that a conductive particle P present between the anode 61 and the electron conveying layer 66, which is caused during the manufacturing process. In order to generate light by injecting carriers into the organic EL layer 62 of the organic EL element 4, a certain voltage is necessarily applied between the anode 61 and the cathode 64 in order to apply an electrical field of, for example, about 5000 V/m.

When an electrical field which exceeds the threshold value for the light emission is applied between the anode 61 and the cathode 64, short-circuiting sometimes occurs between the anode 61 and the cathode 64 at a section where the particle P is present even if very small but conductive. In this case, as shown in the cross section of FIG. 7B, the cathode 64 is damaged by the energy created by the short-circuiting, thus creating a pin hole. This pin hole section does not emit light if a predetermined voltage is applied between the anode 61 and the cathode 64.

In the meantime, in the case where the diameter of the particle P is larger than the thickness of the organic EL layer 62, a hole is sometimes created in the EL layer in the process after the formation of the anode 61 until the cathode 64. Due to this steric hindrance thus created, a pin hole is created in the organic EL layer 62 even if the particle P is not electro-conductive. With this pin hole, short-circuiting occurs between the anode 61 and the cathode 64 thus it is possible to create a further pin hole.

Oxygen or moisture which enters via the interlayer insulation film 52 and from a gap between the interlayer insulation film 52 and the substrate 31, reaches the pin hole created in the cathode 64, and the electron injection layer 66 made of a material having a low work function, in other words, a material which can be easily oxidized, is oxidized around the pin hole as it is darkened in black in FIG. 8B. Thus, as the oxide film grows, the dark spot is gradually radially expanded. The blackened section in FIG. 8A indicates an oxidized section of the electron injecting layer 66. Due to the oxidized section, the electron injecting property is significantly deteriorated. The oxidized section corresponds to a dark spot which does not generate light even if a voltage is applied.

As a further time passes, the oxidized portion of the electron injection layer 66, that is, the dark spot, is grown; however the growth of the dark spot is later inhibited by the partition wall 63 as shown in FIGS. 9A and 9B, and thus the dark spot does not expand to adjacent dot. In other words, the dark spot grows within a region where the electron injection layer 66 is continuously formed; however due to the step made by the partition wall 63, the electron injection layer 66 does not continue to an adjacent dot and therefore the injection layer of the adjacent dot is not oxidized. Therefore, the growth of the dark spot is limited within one dot.

More specifically, the area of one dark spot is limited to 400 $\mu m^2$ at maximum even if the dark spot is created in any dot. For one dark spot, the light emitting area is decreased by an area corresponding to one dot. However, electrons which cannot be injected due to the oxidized film of the electron injection layer 66, which corresponds to the dark spot, are injected into the organic EL layer 62 from the electron injection layer 66 of other dots of the same pixel, on which no oxide film is formed, and therefore the electron injection property per unit area is slightly increased. Consequently, the luminance of all pixels becomes substantially the same. Thus, the light emission of the same luminance can be maintained between a pixel containing a dark spot created and another pixel containing no dark spot. Further, each and every dot is formed in such a fine size that a dark spot, if it is created, having an area of one dot cannot be recognized by naked eye. Therefore, practically, there would be substantial problem.

As described above, in the organic EL element 4 of this embodiment, the presence of a particle creates a pin hole in the organic EL layer 62, which causes short-circuiting between electrodes. Even if the cathode 64 is exposed due to the short-circuiting and thereby the electron injection layer 66 is oxidized, the oxidization can be partially limited by the partition wall. Therefore, the growth of a so-called dark spot occurs only within that dot where the particle is present. That is, in the organic EL element 4, the cathode 64 is continuously formed over a plurality of dots within a pixel. If a dark spot is created in one dot due to a pin hole made therein, the dark spot is not spread to adjacent dots within the same pixel, or even to adjacent pixels. Further, if a dark spot is created, it can hardly be recognized by naked eye, and therefore no practical problem is raised. Thus, the organic EL element 4 can maintain a high display vision quality for a long time.

Figure 10:
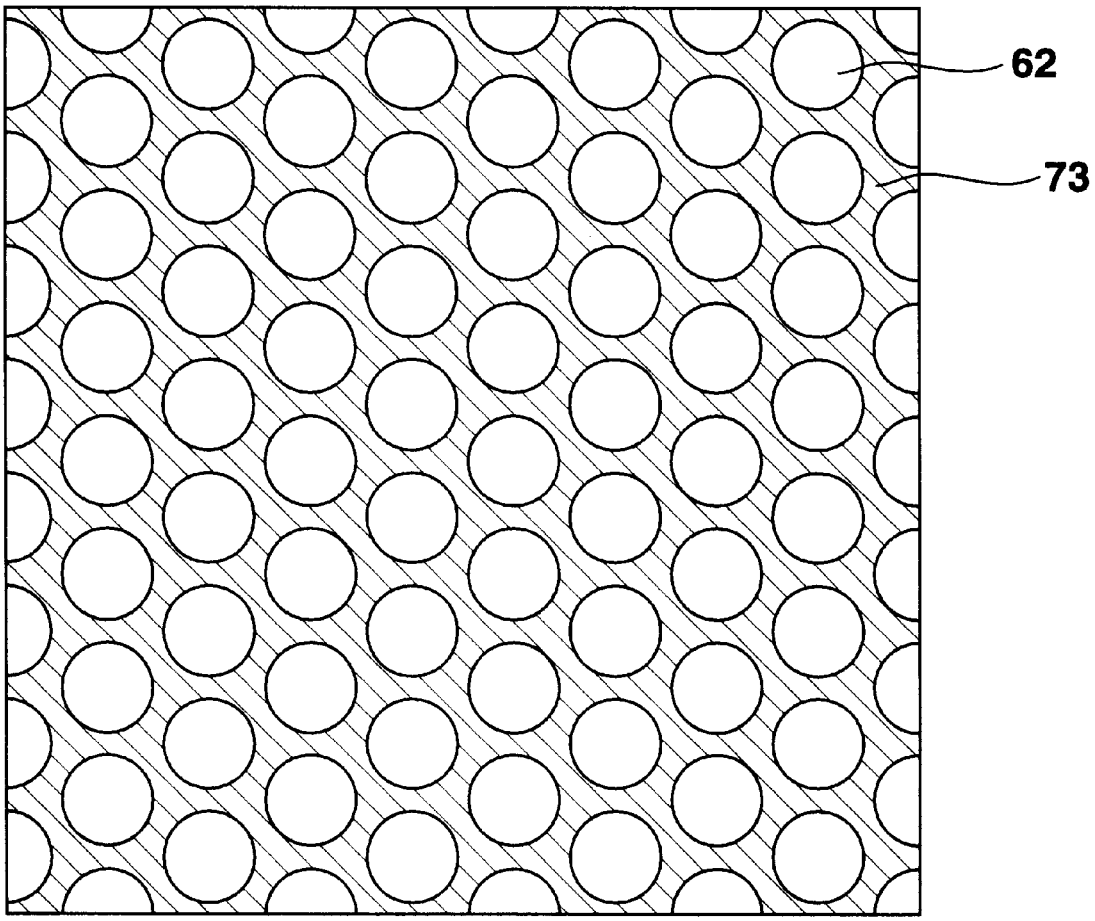
FIG. 10 is a schematic plan view showing an organic EL element having dots of a round shape.

In this embodiment, the number of dots of each pixel 5 of the organic EL element 4 is 88; however the invention is not limited to this, but the number of dots may be changed appropriately in accordance with the size of one pixel or display vision quality. Further, in this embodiment, the shape of the dots of the pixel 5 of the organic EL element 4 is square; however the invention is not limited to this, but the shape of a dot may be circular (or oval) as can be seen in FIG. 10. In the case of the structure where a partition wall 73 is provided to surround circular dots, the physical stress can be more easily dispersed as compared to the case of angular dots, and therefore such a structure has an advantage that a developing solution such as an etching solution can easily flow around during the patterning of the partition wall 73.

Figure 11:
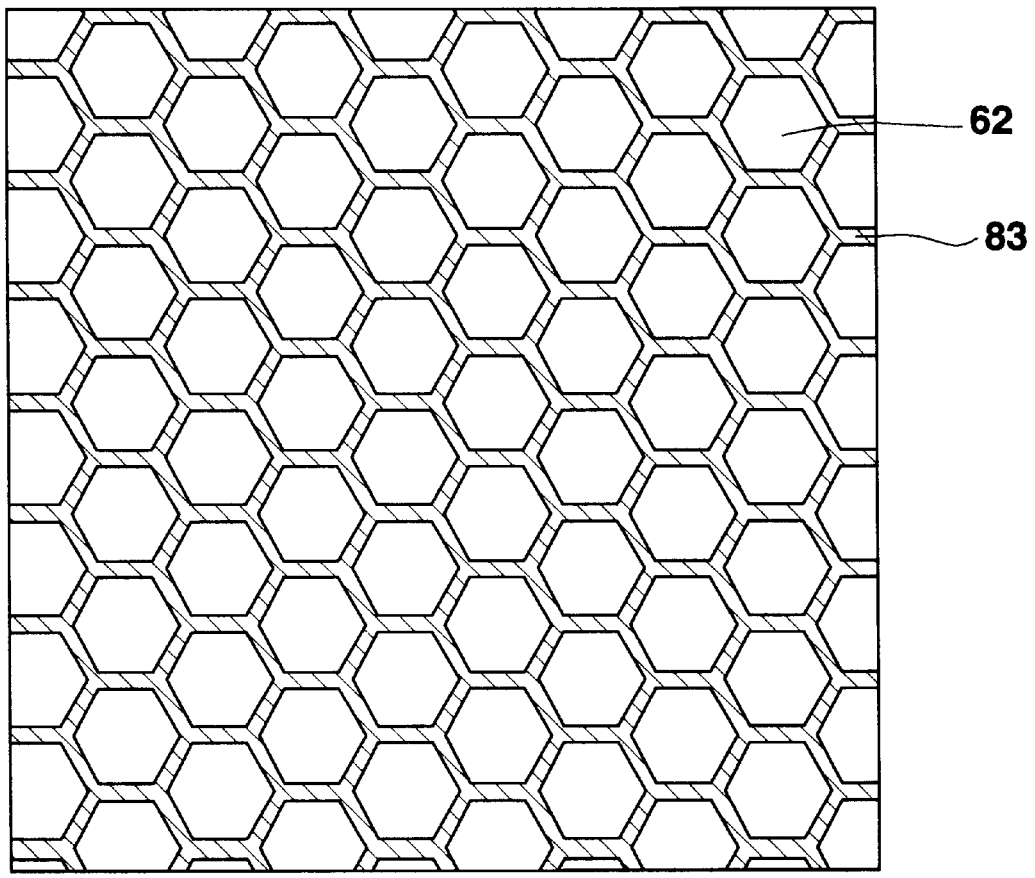
FIG. 11 is a schematic plan view showing an organic EL element having dots of a hexagonal shape.

Alternatively, as shown in FIG. 11, when dots are formed into a hexagonal shape to have a honeycomb structure, and thus a partition wall 83 is provided around each dot, the area ratio of the partition wall becomes low, and the ratio of the light emitting area per pixel can be increased. It should be noted that the manufacture process for the organic EL elements shown in FIGS. 10 and 11 is the same as that employed in the present embodiment.

In the above-described embodiment, each dot is a right square having a side of 20 $\mu$m, and the area thereof is 400 $\mu m^2$. Further, the width of the branch for the partition wall 63 is 4 $\mu$m. However, the area and width are not limited to the above case. It should be noted that in generally, when the area of one dot is 10000 $\mu m^2$ or less, and the width of the branch for the partition wall 63 is 50 $\mu$m or less, the presence of a dark spot created in one dot and the presence of the partition wall 63 becomes non-recognizable by naked eye.

In the above-described embodiment, the thickness of the anode 61 is 250 nm, the thickness of the cathode 64 is 200 nm to 1000 nm, the thickness of the organic EL layers 62 and 65 is 40 nm to 250 nm, the thickness of the partition wall 63 is 150 nm to 500 nm, and the thickness of the electron injection layers 66 and 67 is 5 nm to 200 nm. With regard to the thickness of each layer, the following conditions must be satisfied. That is, the thickness of the partition wall 63 is always larger than the sum of the thickness of the organic EL layer 62 and the thickness of the electron injection layer 66, and the cathode 64 is thicker than the partition wall 63, preferably, the sum of the thickness of the partition wall 63, the thickness of the organic EL layer 65 and the thickness of the electron injection layer 67.

In the above-described embodiment, the organic EL layer 62 and the electron injection layer 66 are formed on the entire resultant after the formation of the partition wall 63. Therefore, the organic EL layer 65 and the electron injection layer 67 are formed even on the partition wall 63, 83. However, it is alternatively possible that after the formation of the organic EL layer 65 and the electron injection layer 67, the portions of the organic EL layer 65 and electron injection layer 67, which are situated on the partition wall 63, are removed. The material of the partition wall 63 is not limited to silicon nitride, but may be an insulating material such as silicon oxide.

Next, the drive principle of the display device 1 of the present invention will now be described.

The address driver circuit 9 supplies address signals to address lines 5 in the order from terminals X1 to Xm. The address signal selects the selection transistor 2 connected to a certain address line 5, and in synchronism with this, the data driver circuit 10 supplies data signals to the respective data lines 6 from the terminals Y1 to Yn. The data signal is charged to the capacitor 7 via the selection transistor 2. Here, the data signal is supplied to the gate electrode of the drive transistor 3 so as to drive the drive transistor 3, and turn it on for about a period of one frame. The drain electrode of the drive transistor 3 is connected to the power source 11 via the power line 8, and a negative voltage is applied thereto. Therefore, while the drive transistor 3 is turned on, the drive transistor 3 keeps on allowing a drain current to flow to the organic EL element 4, thus causing the light emission. The luminance of the light emitted from the organic EL element 4 is controlled by the data signal from the data driver circuit 10 or the voltage of the power source 11 or the like, or it can be controlled in gradation by controlling the light emitting period.

In the above-described embodiment, the organic EL element 4 has a two-layer structure of a positive hole conveying layer and an electron conveying light emitting layer, and is designed to emit light of a single color. However, the organic EL layer 62 may be formed to have three layers or more, of a positive hole conveying layer, a light emitting layer and an electron conveying layer. Further, the organic EL material used here is not limited to the above-described type, but some other material may be used to emit light of other color. Furthermore, it is possible that organic EL layers which generate light of several wavelength components such as of red, green and blue, are formed in a certain order, to achieve a multi-color or full-color display.

(Second Embodiment)

Another active drive-type electrical field light emitting display device according to the present invention will now be described in detail with reference to accompanying drawings, as another embodiment. The members substantially the same as those of the first embodiment will be designated by the same reference numerals.

Figure 12:
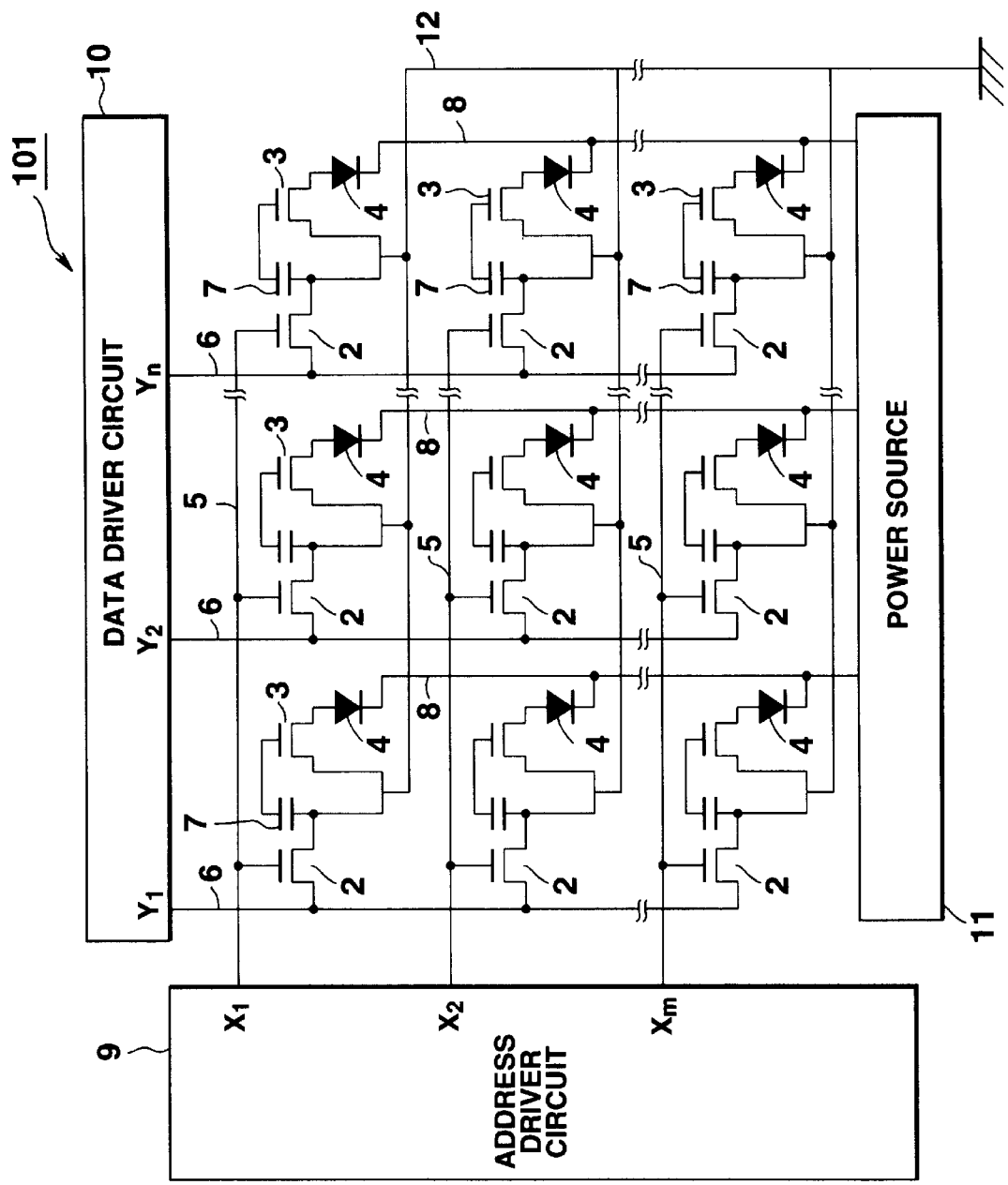
FIG. 12 is an equivalent circuit diagram showing an active drive type display device according to a second embodiment of the present invention.

First, the drive circuit of a display device 101 shown in FIG. 12 will now be described. As shown, pixels each constructed of a selection transistor 2, a drive transistor 3, an organic EL element 4 and a capacitor 7, are arranged in matrix on a substrate 31. An address line 5 is connected to a gate electrode of each selection transistor 2 and a data line 6 is connected to a drain electrode of each selection transistor 2. A source electrode of each selection transistor 2 is connected via the capacitor 7 to a gate electrode of the drive transistor 3, and also is grounded via a ground line 12. A drain electrode of the drive transistor 3 is connected to an anode of the organic EL element 4, and a source electrode of the transistor 3 is connected to the ground line 12. Cathodes 64 of the organic EL elements 4 of pixels located adjacent to each other in the direction along the data line 6 are connected to each other to form a power line 8. An address driver circuit 9 and a data driver circuit 10 are provided on the substrate such that they are arranged along the respective two sides of pixels aligned in matrix. Address lines 5 are connected respectively to terminals X1, X2, ... Xm of the address driver circuit 9, and data lines 6 are connected to Y1, Y2, ... Yn of the data driver circuit 10. The power line 8 is connected to a power source 11, which supplies a negative potential.

Figure 13:
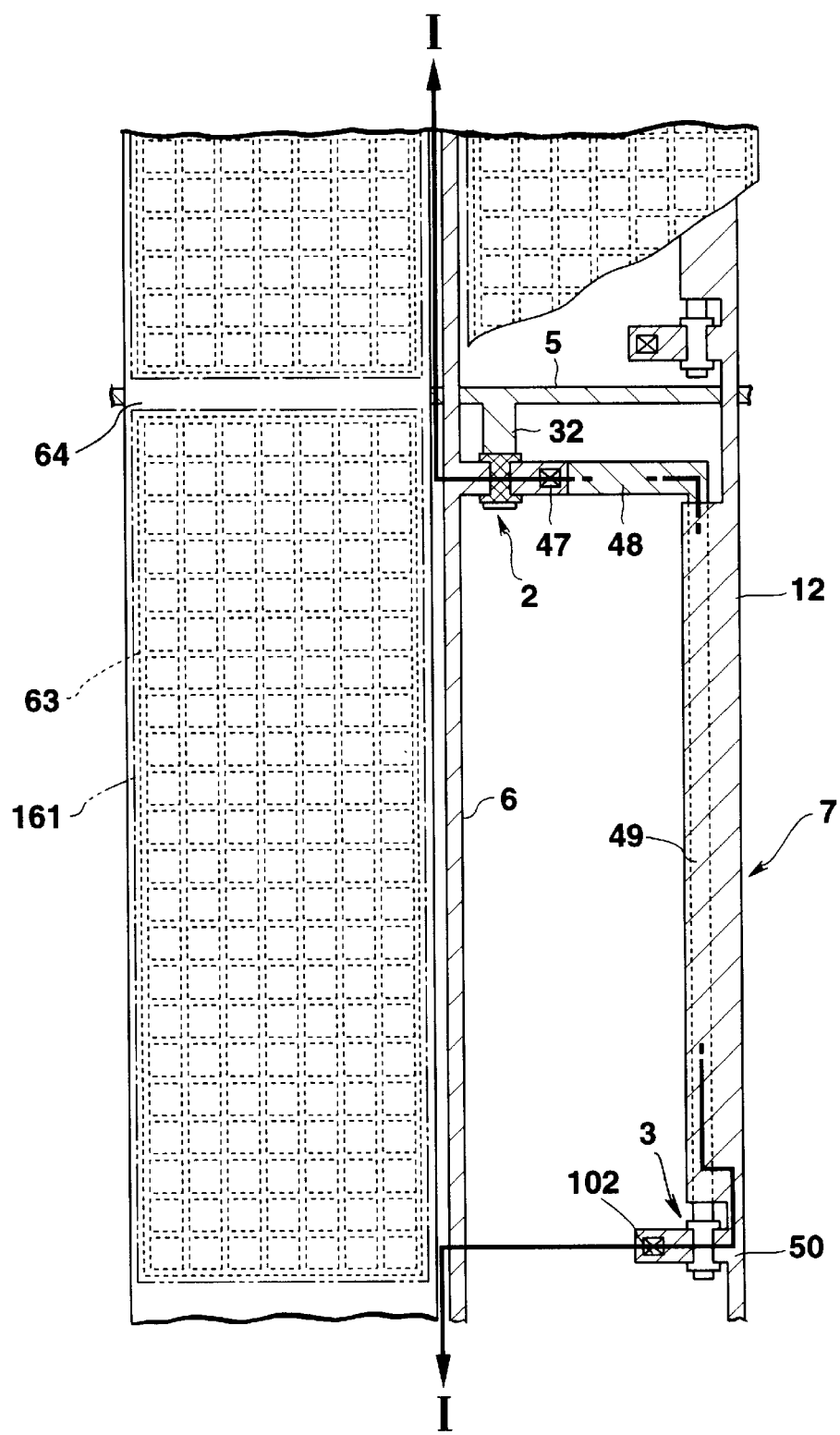
FIG. 13 is a schematic plan view showing a part of the display device shown in FIG. 12.
Figure 14:
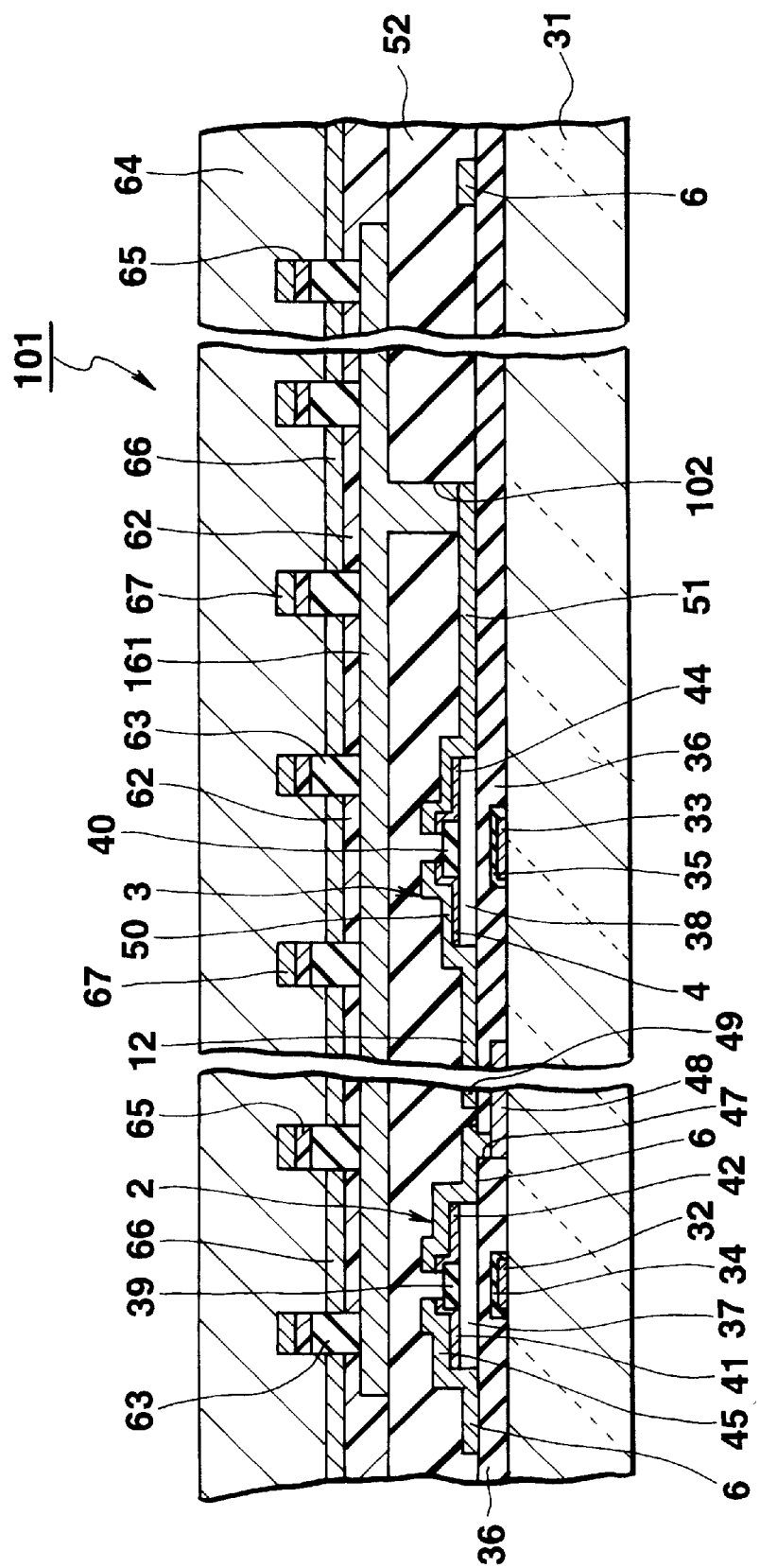
FIG. 14 is a schematic cross section taken along the line I—I of FIG. 13.

As shown in FIG. 13, an upper wiring layer 49 of the capacitor 7 and the drain electrode of the drive transistor 3 are connected to the ground line 12. A source electrode 51 of the drive transistor 3 is connected to an anode 161 provided on an interlayer insulation film 52 formed on the entire surface to cover the selection transistor 2 and the drive transistor 3 as shown in FIG. 14 which shows a cross section taken along the line I—I of FIG. 13. The anode 161 is formed also above the selection transistor 2, the drive transistor 3 and the capacitor 7, in addition to the region of the anode electrode 61 shown in the Embodiment 1, when observed as a plan view.

Each organic EL element 4 includes an anode 161, organic EL layers 62 and 65, an insulation partition wall 63, electron injection layers 66 and 67 and a cathode 64 formed in the order in a contact hole 102 and on the interlayer insulation film 52. The anode 161 is an electrode designed to inject positive holes to the organic EL layer 62, and is made of transparent indium tin oxide or indium zinc oxide. On the anode 161, the partition wall 63 having a structure in which branches extend in the horizontal and vertical directions, and having a plurality of openings surrounded by these branches. The partition wall 63 is formed to have a thickness of about 150 nm to 500 nm. The organic EL layer 62 has a thickness of about 40 nm to 250 nm, and is made always thinner than the partition wall 63. The organic EL layer is constructed by an organic EL layer 62 formed on the anode 161, which contributes to the light emission, since it is formed after the formation of the partition wall 63, and the organic EL layer 65 situated on the partition wall 63, which does not contribute to the light emission. The organic EL layers 62 and 65 are formed to be separated from each other. With the above-described structure, the organic EL layer 62 is divided into (7×22) dots, four sides of each of which are surrounded by the partition wall 63. Each dot is a right square having a side of 20 μm, and the width of the partition wall 63 is 4 μm. The electron injection layers 66 and 67 are conductive layers made of a single metal having a low work function, such as lithium or magnesium, or an alloy, or the like, and they are layers for injecting electrons into the organic EL layers. The electron injection layer 66, which does not contribute to the light emission, is formed on the organic EL layer 62, and the electron injection layer 67 which does not contribute to the light emission is formed on the organic EL layer 65. They have substantially the same thickness, specifically, 5 nm to 200 nm, and are formed thinner than that of the partition wall 63. Further, they are separated by the partition wall 63. The partition wall 63 is formed to always have a thickness larger than the sum of the thickness of the organic EL layer 62 and the thickness of the electron injection layer 66. The cathode 64 is a conductive layer having a thickness of 200 nm to 1000 nm and made of a single metal having a work function higher than those of the electron injection layers 66 and 67, such as aluminum or chromium, or an alloy which contains the mentioned single layer. This conductive layer is deposited such as to stride over the electron injection layer 66 and the electron injection layer 67 formed on the partition wall 63. The cathodes 64 of the organic EL elements 4 of the pixels located adjacent to each other in the direction along the data line 6 are connected to each other to form a power line 8. In each organic EL element 4, even if a predetermined current is allowed to flow between the anode 61 and the cathode 64, positive holes cannot be injected into the organic EL layer 65 since the partition wall 63 serves as a thick insulation member, and therefore the organic EL layer 65 does not emit light. Instead, electrons and positive holes are injected into the organic EL layer 62 of (7×22) dots and the portion of the organic EL layer 65, which is situated on the peripheral portion of the anode 61, thus emitting light from the organic EL layer 62.

In the organic EL element 4 of the display device 101, the growth of one dark spot is not spread to another dot adjacent thereto. Further, even if a dark spot is created, it cannot be identified by naked eye, and therefore no practical problem occurs. Consequently, the organic EL element 4 can maintain a high display vision quality for a long term. Further, since the display device 101 is formed above the selection transistor 2 and the drive transistor 3, the number of dots per one pixel can be made larger as compared to the case of the display device 1 of the first embodiment, and therefore the light emission area per pixel becomes larger.

(Second Embodiment)

Figure 15:
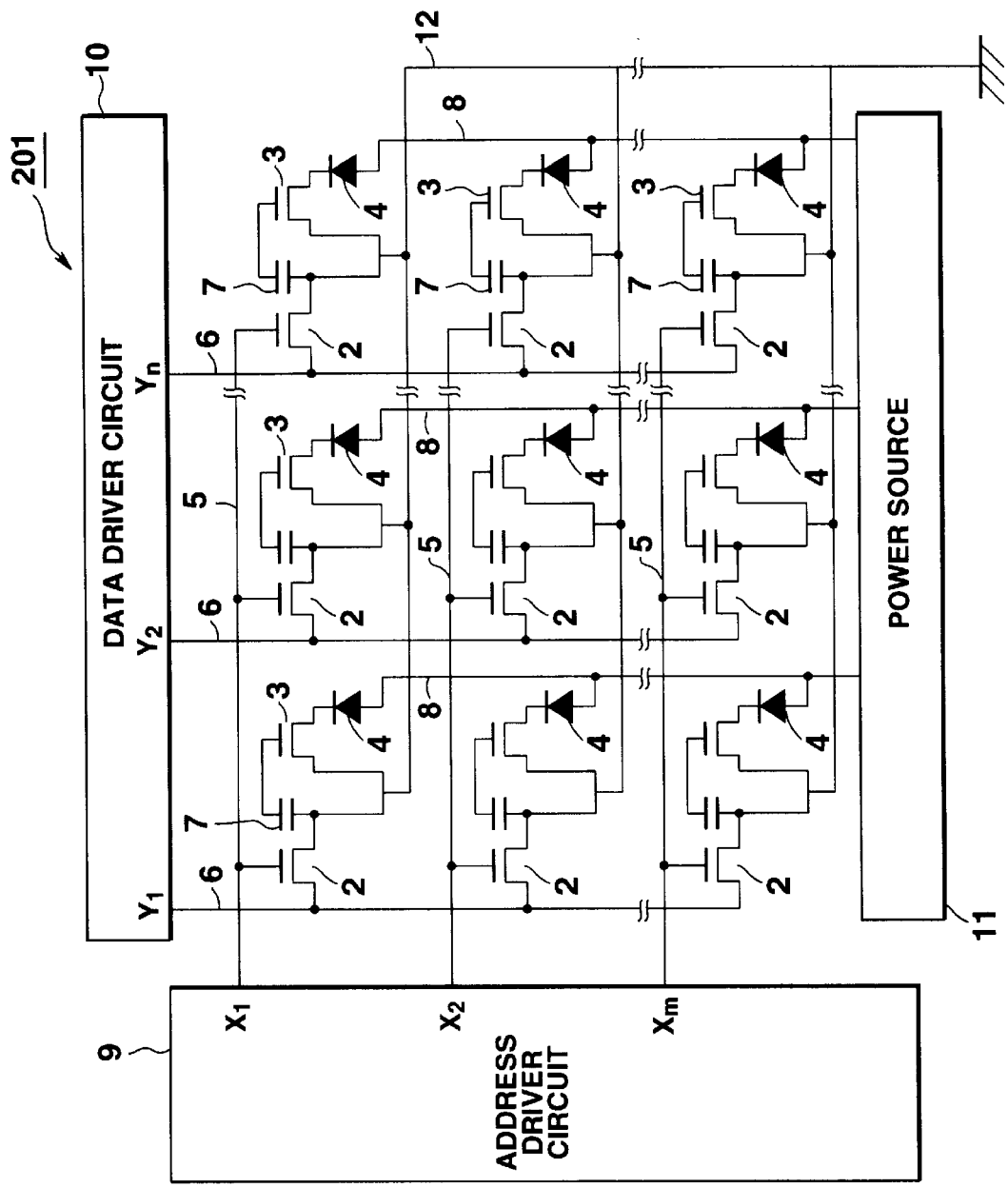
FIG. 15 is an equivalent circuit diagram showing an active drive type display device according to a third embodiment of the present invention.
Figure 16:
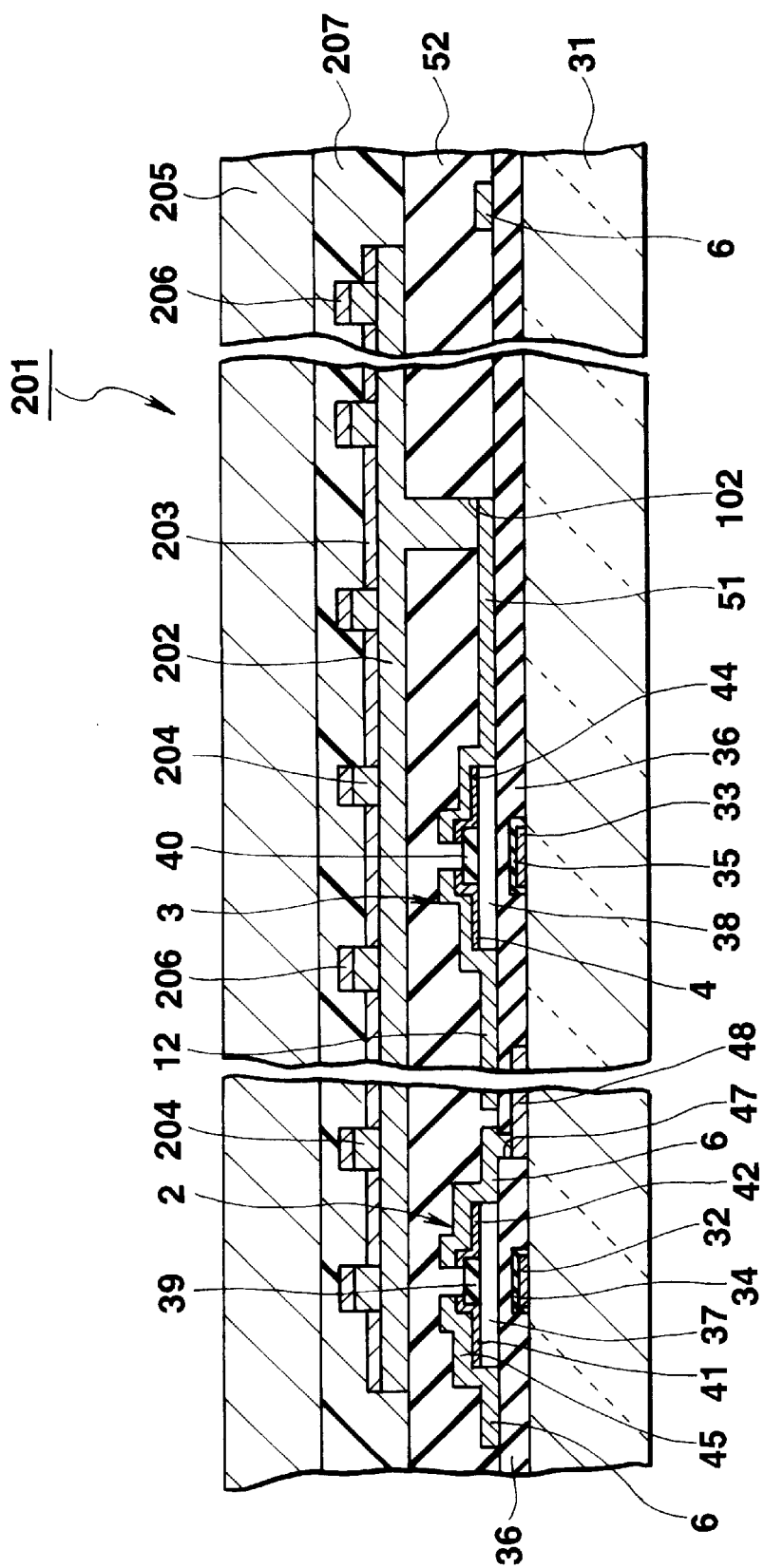
FIG. 16 is a schematic cross section of what is shown in FIG. 15.

Still another active drive-type electrical field light emitting display device according to the present invention will now be described in detail with reference to accompanying drawings, as another embodiment. FIG. 15 is a circuit diagram illustrating the display device of this embodiment, and the members substantially the same as those of the second embodiment will be designated by the same reference numerals. A power source 11 differs from that of the second embodiment in the respect that it supplies a positive voltage via a power line 8. FIG. 16 is a cross section of the electrical field light emitting display device. A selection transistor 2, a drive transistor 3, an address line 5, a data line 6, a capacitor 7, a power line 8 and a ground line 12 of this embodiment are substantially the same as those of the second embodiment, and the anode and cathode of the organic EL element 4 and the electron conveying layer and positive hole conveying layer of the organic EL layer are arranged reverse to those of the second embodiment.

Specifically, a plurality of pixel electrodes 202 divided for pixels are respectively provided in contact holes 102, and a conductive partition wall 204 having a plurality of rectangular openings is formed on each of the pixel electrodes. An electron injection layer 203 is formed in an opening of the partition wall 204, and an electron injection layer 206 is formed on the partition wall 204. The organic EL layer 207 is formed on the entire surface of each of the pixels, and an anode 205 which also serves as power lines 8 in the same number of the data lines 6 is formed along the data lines 6, on the organic EL layer 207.

The thickness of the organic EL layer 207 is set larger than the thickness of the partition wall 204 so that short-circuiting does not occur between the anode 205 and electron injection layer 206, and preferably, it should be set larger than the sum of the thickness of the electron injection layer 206 and the thickness of the partition wall 204. The partition wall 204 is designed to divide the electron injection layer 203 within the same pixel into dot-shaped sections, and therefore it is formed to be thicker than the electron injection layer 203. In the organic EL element 4, when a predetermined voltage is applied between the pixel electrode 202 and the anode 205, electrons are injected from the electron injection layers 203 and 206 via the pixel electrode 202 and the partition wall 204, and positive holes are injected from the anode 206, into the organic EL layer 207, within recombination occurs to generate light.

In the organic EL element 4 described above, even if the electron injection layers 203 and 206 which are in contact with the organic EL layer 207 are oxidized to create a dark spot, the dark spot does not stride over the partition wall 204, and therefore it not substantially possible that one whole pixel stops emitting light due to the growth of a dark spot. Consequently, a very high display vision quality can be maintained for a long time period.

Figure 17A:
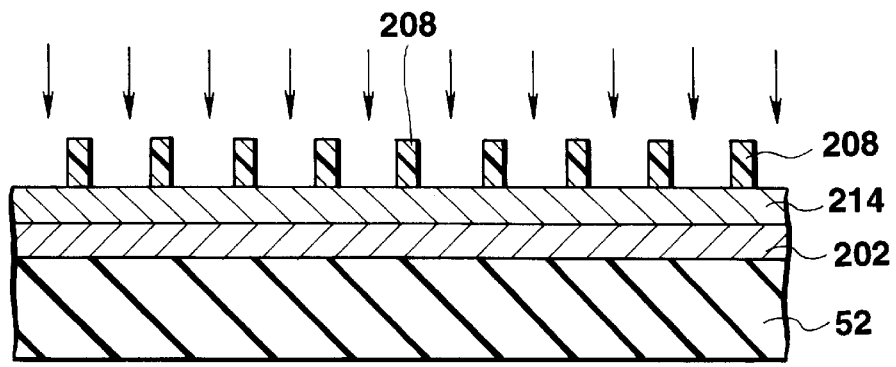
Figure 17B:
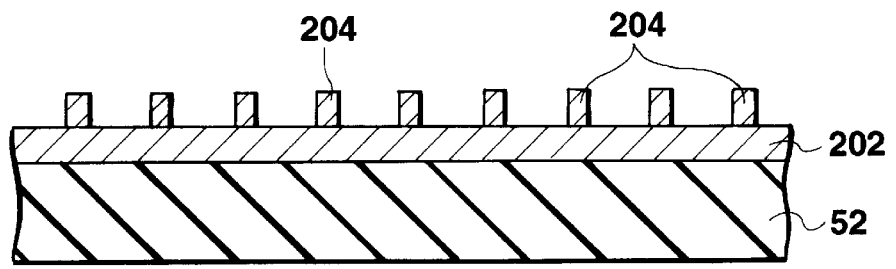
Figure 17C:
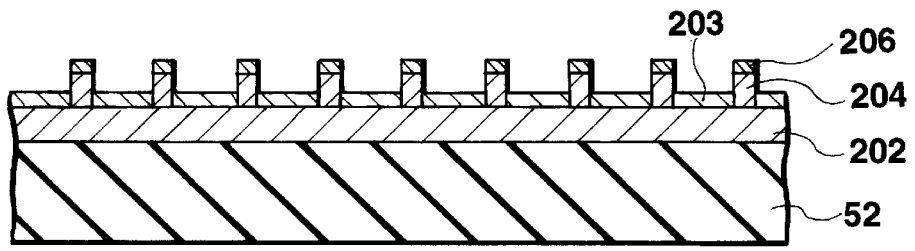
Figure 17D:
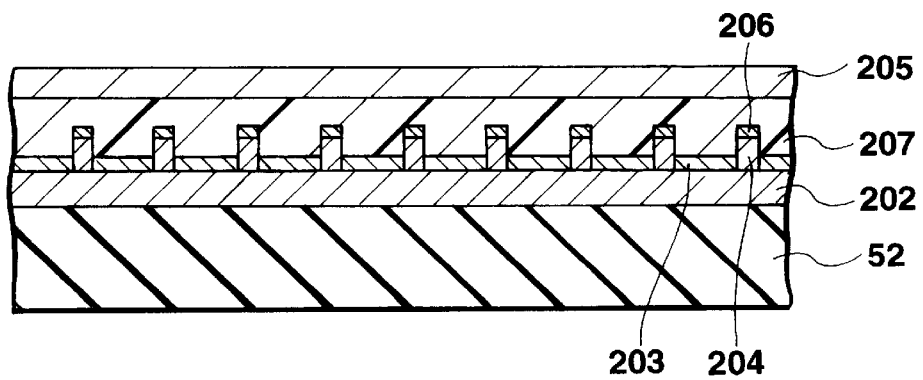

Next, a method of manufacturing the organic EL element 4 of the embodiment will now be described. First, as shown in FIG. 17A, one aluminum film is deposited on the interlayer insulation film 52 and in the contact hole 102 of the interlayer insulation film 52, and then the deposited layer is subjected to pattering using the photolithography and etching techniques, so as to form a pixel electrode 202 connected to each of the drive transistors 3. Further, on the pixel electrode 202, one separating film 214 made of a high conductive material having a high work function, which is not easily oxidized in the thickness direction, such as indium tin oxide, indium zinc oxide or aluminum, which is conductive. Then, one photo-resist mask 208 formed in a lattice form is formed on the resultant. After that, the exposed portion of the separating film 214 is etched with an etching solution, and thus one partition wall 204 in which branches extend in a matrix manner is formed for each pixel, as shown in FIG. 17B. Subsequently, as the electron injection layers 66 and 67, conductive layers each made of a single metal having a low work function such as lithium or magnesium, or an alloy or the like, are deposited by deposition or sputtering. As shown in FIG. 17C, the conductive film is divided by the partition wall 204 into an electron injection layer 203 having a rectangular dot shape and formed on the pixel electrode 202, and an electron injection layer 206 formed on the partition wall 204. Then, as shown in FIG. 17D, an electron conveying layer and a positive hole conveying layer are laminated in this order, thus forming an organic EL layer 207. After that, an anode 205 which also serves as a power line 8 is formed on the positive hole conveying layer to be placed along the data lines 6.

In this embodiment, electrons are injected into the organic EL layer 207 from the injection layers 203 and 206 which are in contact with the layer 207. With the structure of this embodiment, the contact area of the portion of the side wall of the electron injection layer 206 can be increased, and therefore the electron injection area is increased, which is advantageous. Particularly, since the partition wall 204 is made of a conductive material, it is possible to allow a current to flow to the electron injection layer 206. Further, since there is the pixel electrode 202, the cathode, as a whole, has a low resistance, and therefore the electron injection layer 203 can be made thin.

Moreover, with the above-described manufacturing method, when the partition wall 204 is patterned, the organic EL layer 207 is not yet formed, and therefore the organic EL layer 207 is not exposed to the resist, etchant, resist removing solution and the like, which are used in the patterning. Therefore, the organic EL layer 207 is never deteriorated by the effects of these materials.

(Fourth Embodiment)

Figure 18:
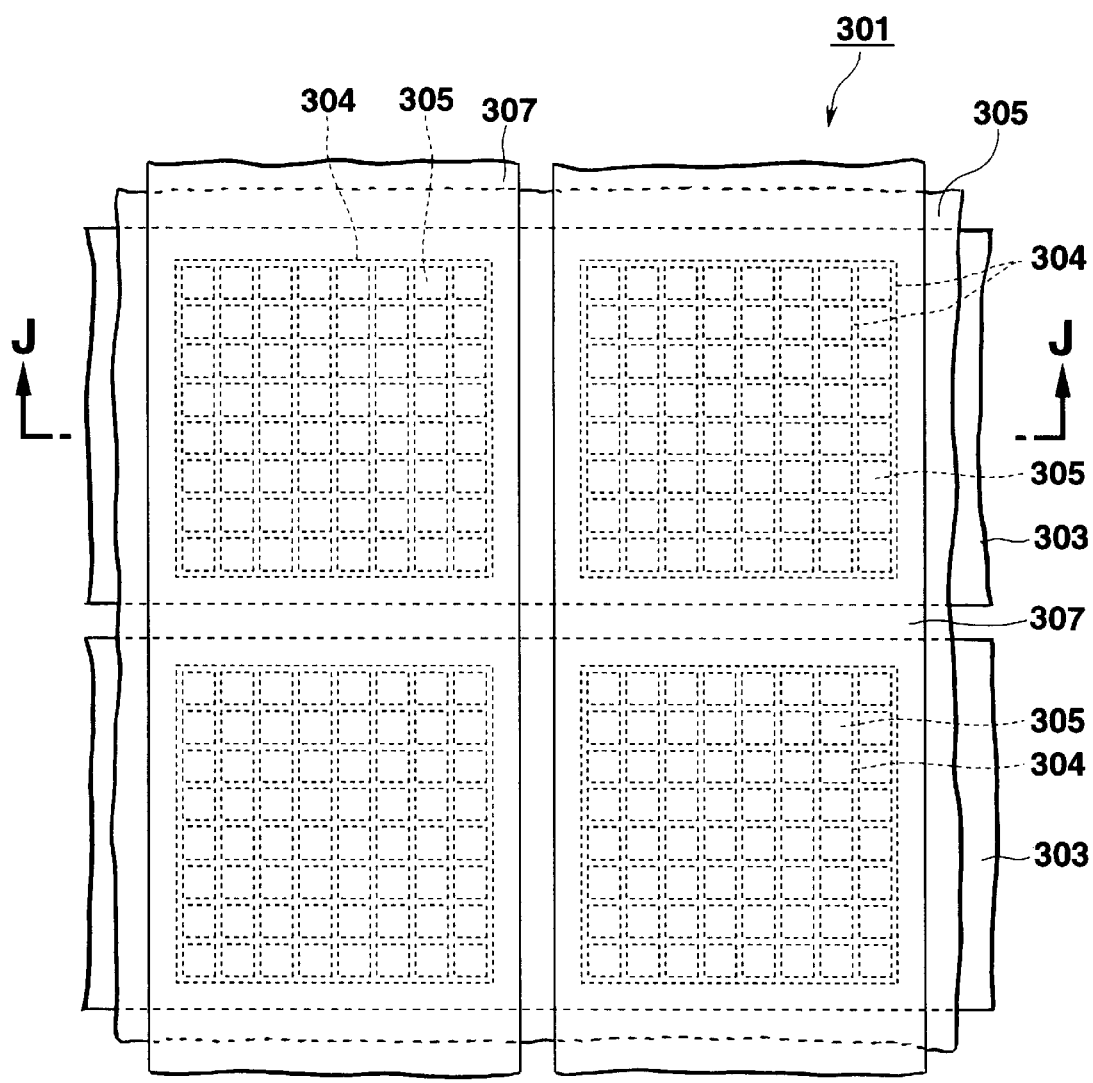
FIG. 18 is a plan view showing a part of a simple matrix drive type display device according to the fourth embodiment of the present invention.
Figure 19:
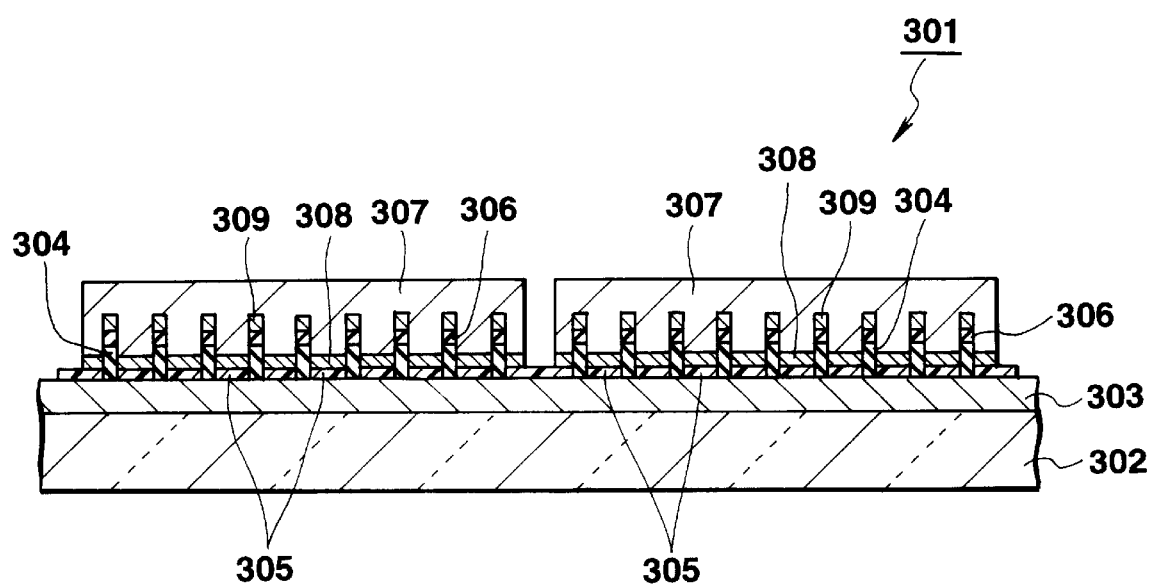
FIG. 19 is a cross section taken along the line J—J of FIG. 18.

FIG. 18 is a plan view showing a part of the organic EL element 4 of the simple matrix drive type display device 301 according to another embodiment of the present invention. FIG. 19 is a cross section taken along the line J—J in FIG. 18.

The organic EL element 4 includes a plurality of anodes 303 formed in the order on a substrate 302, a partition wall 304 having a plurality of openings arranged in matrix, which are formed as a plurality of branches extend in the vertical and horizontal directions to surround each opening, an organic EL layer 305 formed on the anodes 303, which is exposed by the openings of the partition wall 304, an organic EL layer 306 formed on the partition wall 304, which is separated from the organic EL layer 305, an electron injection layer 308 provided on the organic EL layer 305, an electron injection layer 309 provided on the organic EL layer 306, which is separated from the electron injection layer 308, and a plurality of cathodes 307 provided to cover the surface of the organic EL layer 305, the side walls of the partition wall 304, the side walls of the organic EL layer 306 and the electron injection layer 309. The anodes 303 are electrodes designed to inject positive holes into the organic EL layer 305, and used as scanning electrodes (or signal electrodes) of the organic EL element 4. The cathodes 307 cross with the anodes 303 at right angles, and are formed to have substantially the same width and to be in parallel with each other. The organic EL layer 306 is separated from the other organic EL layer 305 by a step created by the partition wall 304, and the electron injection layer 308 is separated from the other electron injection layer 309 by the step created by the partition wall 304 as well. That is, the partition wall 304 is formed by deposition to be thicker than the sum of the thickness of the organic EL layer 305 and that of the electron injection layer 308. Each pixel formed at a cross section of each anode 303 and each cathode 307 of the organic EL layer 4, includes a plurality of rectangular dots partitioned by the partition wall 304. Each dot is a right square having a side of 20 $\mu$m, and there are 64 of them, that is, 8 columns and 8 rows. The width of the partition wall 304 between adjacent dots is 4 $\mu$m.

The substrate 302 is made of a transparent glass or plastic material, and has a thickness of about 0.5 mm. Each anode 303 is made of a transparent ITO (indium tin oxide) or the like, and has a thickness of about 250 nm. The partition wall 304 is formed continuously such as to surround the dots, and is made of a material having an insulating property such as that of $SiO_2$ or $SiN_x$, which is not oxidized with oxygen or moisture or does not release oxygen or water from itself. The thickness of the layer of the partition wall 304 is about 200 to 500 nm. The organic EL layer 305 on the anode 303 and the other organic EL layer 306 on the partition wall 304 are formed in the same process, and these layers are respectively made of a positive hole conveying layers formed on the anode 303 and partition wall 304, and electron conveying light emitting layers formed on the positive hole conveying layers. The thickness of each of the organic EL layers 305 and 306, that is, counting the positive hole conveying layer and electron conveying light emitting layer all together, is about 40 nm to 250 nm. The thickness of the electron injection layer 308 or 309 is about 5 nm to 200 nm. Since the partition wall 304 is formed thicker than the total thickness of the organic EL layer 305 and the electron injection layer 308, the organic EL layer and the electron injection layer are disconnected by the partition wall 304. Consequently, the organic EL layer 305 of one dot is made noncontinuous to another organic EL layer 305 of an adjacent dot, or the organic EL layer 306 on the partition wall 304, or the electron injection layer 308 is formed noncontinuous to another electron injection layer 308 of an adjacent dot or the electron injection layer 309 formed on the organic EL layer 306.

The organic EL layer 305 emits light by the following mechanism. That is, a voltage is applied between the electrodes to allow an electron to flow between the electrodes, and thus positive holes and electrons are recombined. Thus, as the excitation energy is absorbed in the electron conveying light emitting layer, the light is generated. The organic EL layer 305 includes the electron conveying light emitting layer which is selectively made of a light emitting material, and thus it emits visible light of a predetermined wavelength region via the anode 303 and the substrate 302. The cathode 307 is formed by the deposition of an aluminum film, an aluminum alloy or a chromium film, having a thickness of 200 nm to 1000 nm, such as to stride over both a plurality of dots and partition walls within the same pixel. The electron injection layer 308 is a conductive layer made of a single metal having a low work function such as lithium or magnesium, an aluminum-lithium alloy or the like, so as to make it easy for electrons to flow to the electron conveying light emitting layer of the organic EL layer 305. The thickness of the electron injection layer 308 is about 5 nm to 200 nm.

It should be noted that the organic EL element 4 having the above-described structure is sealed with a sealing material made of a resin or the like, from the outer surface, or another substrate is provided on the cathode 307 side, and silicon oil is sealed between these substrates. With this structure, the entrance of oxygen and moisture can be avoided.

The manufacturing process of the organic EL element 4 will now be described.

First, an ITO-made thin film is deposited to have a thickness of about 250 nm on the entire surface of the substrate 302, by the sputtering method. Then, the unnecessary portion of the deposited ITO film, that is, the portion other than the section which give rise to a plurality of anodes 303 arranged in parallel to each other, is removed by the photolithography method. Thus, anodes 303 which serve as scanning electrodes are formed on the substrate 303. Then, $SiO_2$ is deposited to form a film having a thickness of about 200 nm to 500 nm on the substrate 302 on which the anodes 303 are formed, by the CVD (chemical vapor deposition) method. After that, the unnecessary portion of the deposited $SiO_2$ film is removed by the photolithography method. Thus, the partition wall 304 is formed on the substrate 302 on which the anodes 303 are formed. Next, on the substrate 302 on which the anodes 303 and the partition wall 304 are formed, a film of N,N'-di($\alpha$-naphthyl)N,N'-diphenyl-1,1'-biphenyl-4,4'-diamine (to be abbreviated as $\alpha$-NPD), which is the material for a positive hole conveying layer, is formed to have a thickness of about 50 nm, by vacuum deposition or printing through ink jet. After the completion of the vacuum deposition of $\alpha$-NPD, beryllium-bis(10-hydroxybenzo[h]quinolinate), which is the material for a positive hole conveying light emitting layer, is formed to have a thickness of about 50 nm, by vacuum deposition or printing through ink jet. Thus, the organic EL layers 305 and 306 each having a thickness of about 100 nm are formed noncontinuously on the dots and the partition wall 304. Then, a single metal having a low work function such as lithium or magnesium, or an alloy of, for example, aluminum-lithium, or the like is applied to have a thickness of about 10 nm, to form an electron injection layer 308 on the organic EL layer 305, and an electron injection layer which is separated from the electron injection layer 308, on the organic EL layer 306. Then, a conductive film containing aluminum or chromium is vacuum-deposited to have a thickness of 500 nm, while a metal mask provided with windows of the region corresponding to a plurality of cathodes 307 formed in parallel with each other, is aligned at a predetermined position, thus forming a plurality of cathodes 307 serving as signal electrodes, arranged in parallel to each other.

Even in the case where the interface between the electron injection layer 308 and the organic EL layer 305 is oxidized to create a dark spot, the growth of the dark spot is stopped by the partition wall 304, and it does not spread to the electron injection layer 308 of an adjacent dot. In other words, the dark spot grows within a region where the electron injection layer 308 of the dot is formed continuous, but the electron injection layer 308 of an adjacent dot is formed noncontinuous due to the step made by the partition wall 304, and therefore it is not oxidized. Consequently, the growth of the dark spot is limited within one dot. That is, the area of one dark spot is limited to 400 $\mu m^2$ at maximum. Further, since the growth of the dark spot does not spread to one entire pixel or a plurality of pixels over which the cathodes 307 are formed continuous. A dark spot having an area equivalent to one dot cannot be recognized by naked eye, and therefore such a dark spot would not bring any practical problem.

In this embodiment, in order to avoid the separation of cathodes 307 within one pixel from each other by the partition wall 304, the thickness of the cathode 207 is made always thicker than the partition wall 304, or preferably it is made thicker than the sum of the thickness of the partition wall 304, the thickness of the organic EL layer 306 and the electron injection layer 309. Further, the thickness of the partition wall 304 is made thicker than the sun of the thickness of the organic EL layer 305 and the thickness of the electron injection layer 308 so that the organic EL layer 305 and the electron injection layer 308 can be separated from the organic EL layer 306 and the electron injection layer 308 formed on the partition wall 304.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A display device having a plurality of pixels each comprising:
   a first electrode;
   a partition wall having a plurality of openings, formed on said first electrode;
   a plurality of light emitting layers surrounded by said partition wall, formed respectively in said plurality of openings of said partition wall;
   a plurality of conductive layers surrounded by said partition wall, formed respectively on said plurality of light emitting layers; and
   a second electrode formed to cover said plurality of conductive layers and said partition wall.

2. A display device according to claim 1, wherein said plurality of conductive layers are separated from each other by said partition wall.

3. A display device according to claim 1, wherein said partition wall is formed thicker than a sum of a thickness of said light emitting layers and a thickness of said conductive layers.

4. A display device according to claim 1, wherein said second electrode is made thicker than said partition wall.

5. A display device according to claim 1, wherein said partition wall contains an electro-insulator.

6. A display device according to claim 1, wherein said partition wall contains an electro-conductive material.

7. A display device according to claim 1, wherein said plurality of light emitting layers are made of an organic electroluminescent material.

8. A display device according to claim 1, wherein said plurality of conductive layers are made of a single metal such as lithium or magnesium, or an alloy containing said single metal.

9. A display device according to claim 1, wherein said second electrode is made of a single metal such as aluminum or chromium, or an alloy containing said single metal.

10. A display device according to claim 1, wherein said second electrode is a cathode.

11. A display device according to claim 1, further comprising:

an address driver circuit for outputting an address signal;

a data driver circuit for outputting a data signal;

a plurality of selection transistors connected to said address driver circuit and said data driver circuit; and a plurality of drive transistors, a gate of one of which is connected a respective one of the selection transistor, and a source of that one of which is connected to one of said first electrode and said second electrode.

12. A display device according to claim 11, wherein said first electrode, said partition wall, said plurality of light emitting layers, said plurality of conductive layers and said second electrode are formed on an insulation film formed on said elective transistors and said drive transistors.

13. A display device comprising:

a plurality of anodes;

a plurality of cathodes;

wherein one of said plurality of anodes and one of said plurality of cathodes cross to make a region which functions as a pixel, a partition wall having a plurality of openings to expose the anode, formed on each pixel;

light emitting layers formed in said plurality of openings of said partition wall, to be separated from each other; and electro-conductive layers formed on said light emitting layers formed in said plurality of openings of said partition wall, to be separated from each other;

wherein said cathodes covers the electro-conductive layers and said partition wall.

* * * * *